(12) United States Patent
Dabral et al.

(10) Patent No.: US 6,622,256 B1
(45) Date of Patent: Sep. 16, 2003

(54) SYSTEM FOR PROTECTING STROBE GLITCHES BY SEPARATING A STROBE SIGNAL INTO POINTER PATH AND TIMING PATH, FILTERING GLITCHES FROM SIGNALS ON POINTER PATH THEREOF

(75) Inventors: Sanjay Dabral, Palo Alto, CA (US); Alper Ilkbahar, Santa Cruz, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/539,666

(22) Filed: Mar. 30, 2000

(51) Int. Cl.$^7$ .................................................. G06F 1/04
(52) U.S. Cl. .................... 713/600; 713/401; 365/193
(58) Field of Search ................................. 713/400, 401, 713/500, 501, 503, 600; 327/141, 153, 147, 158, 269; 365/191, 193

(56) References Cited

U.S. PATENT DOCUMENTS 5,519,342 A  * 5/1996 McEwan ...................... 327/94
5,828,257 A  * 10/1998 Masleid ....................... 327/276
5,872,959 A  * 2/1999 Nguyen et al. .............. 713/401

* cited by examiner

Primary Examiner—Thomas Lee
Assistant Examiner—Thuan Du
(74) Attorney, Agent, or Firm—Peter Lam

(57) ABSTRACT

A method and apparatus for a strobe glitch protection mechanism for a source synchronous I/O link. One method of the present invention comprises separating a transfer clock having a plurality of transfer clock edges into a pointer path and a timing path. Glitches are filtered from signals on said pointer path. The pointer path and the timing path are coupled to generate latch enable signals to latch data bits.

33 Claims, 10 Drawing Sheets

SYSTEM FOR PROTECTING STROBE GLITCHES BY SEPARATING A STROBE SIGNAL INTO POINTER PATH AND TIMING PATH, FILTERING GLITCHES FROM SIGNALS ON POINTER PATH THEREOF

FIELD OF THE INVENTION

The present invention relates generally to the field of signal transfer between components, and more specifically to a strobe glitch protection mechanism for a source synchronous I/O link.

BACKGROUND OF THE INVENTION

One limitation on the throughput of a computer or other processing system is the interface between integrated circuits and/or other components in the system. Interface circuits often provide input/output (I/O) links for data transfers between components. Improved data transfer circuitry may allow faster and more efficient signaling between various components.

I/O links between components and systems often use data, reference voltage and strobe lines. The reference voltage provides a threshold which allows a signal to be qualified as low or high state, whereas the strobe provides the timing reference i.e. the position of the data bit in a time sequence. The strobe signal functions as a transfer clock. In some data transfer communications, glitches can occur in these signals. A glitch is generally defined as an undesired transition or bounce in a signal. Glitches destroy the integrity of signals on a line. Sources of glitches can include interference, cross talk, ground bounce, mechanical vibrations, etc. Data glitches can cause corruption of data if the glitch occurs at the sampling time at the receiver. Data error checking techniques such as parity or error-correcting code (ECC) can detect and possibly correct an error. However, any glitches in the strobe signal can alter the state machine and disturb the timing context, therefore corrupting future data. Therefore, a strobe glitch can have a catastrophic effect on the I/O link.

There are two types of strobe failures of concern. The first type is an analog glitch or noise that is long enough to cause errant internal strobe behavior, but does not manifest as a double pulse. This type of behavior can be difficult to detect. This error can amount to a slower signal transition edge or a moved edge, but not a full transition. During such a failure, the phase of the strobe with respect to the incoming data could be lost. The second type of strobe failure involves signal noise that creates a double pulse that may be mistakenly counted at the receiver. A double pulse can cause the logic in a state machine to erroneously increment to the next state.

One existing glitch protection scheme can only protect against glitches during master changeover scenarios. Another existing scheme can only detect an error and then flag the error during a break in bus activity. Other glitch protection schemes have uses a phase locked loop (PLL) to filter strobe signals. However, a PLL also filters out data and strobe cycle to cycle timing jitters, leading to undesired loss of timing margin.

FIG. 1 illustrates a block diagram of a typical prior art source synchronous strobe and data circuit 100 at a receiver. The circuit 100 receives a data signal 102 and a strobe signal 103 that have been sent from an external data transfer source. Data 102 is connected to a latch mechanism. The latch mechanism in this example is a set of first in/first out (FIFO) latches 118. Strobe 103 is connected to a delayed lock loop (DLL) 112. The DLL 112 is a chain of delay element that delays the propagation of strobe 103 to node 108 by a desired amount (usually 90°). The delayed version of strobe at node 108 is coupled to a write state machine (WSM) 120 at pointer 122 and latch enable logic 126, 128. Pointer 122 generates a plurality of latch select signals 124 based on transitions on strobe 103. Latch enables 114, 116 to the FIFO 118 are generated from latch enable logic 126, 128. For this example, latch selects 124 are logically anded together with delayed strobe 108 at and gates 126, 128.

The DLL 112 rotates STROBE 103 to a 90° position. This 90° phase shift allows the strobe signal to center the data window. However, the DLL 112 only performs a rotation and delays STROBE 103. If STROBE 103 is noisy or has glitches, the noise and glitches are simply rotated 90° and propagated out to the WSM 120.

This example circuit at the receiver end of the data transfer uses a strobe having a 90° rotation to advance the write pointer and latch incoming data. In other circuits, the strobe can be set at a 90° position at the driver end. But in either case, the noise and degraded signal quality can cause strobe glitches. It may be especially advantageous to identify options for strobe glitch protection and detection.

BRIEF DESCRIPTION OF THE DRAWINGS

The present invention is illustrated by way of example and not limitations in the figures of the accompanying drawings, in which like references indicate similar elements, and in which.

DETAILED DESCRIPTION

Figure 1:
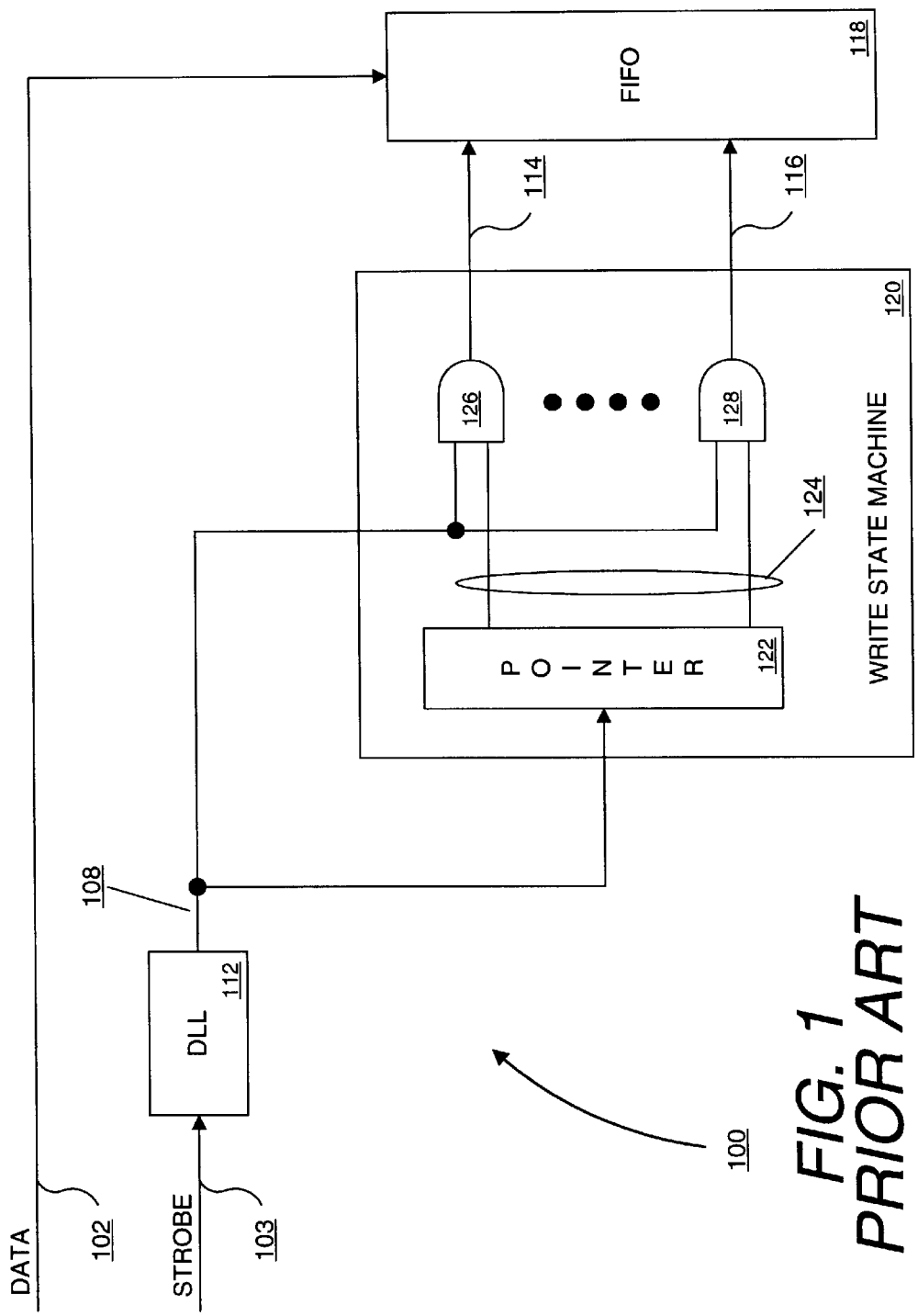
FIG. 1 illustrates a block diagram of a typical prior art source synchronous strobe and data circuit at a receiver.

A strobe glitch protection mechanism for a source synchronous I/O link is disclosed. The described strobe and data circuits are used to transfer data between integrated circuits, but are not so limited. Although the following embodiments are described with reference to processors, other embodiments are applicable to other integrated circuits or logic devices. The same techniques and teachings of the present invention can easily be applied to other types of circuits or semiconductor devices that use a synchronous I/O link.

In the following description, for purposes of explanation, numerous specific details are set forth in order to provide a thorough understanding of the present invention. One of ordinary skill in the art, however, will appreciate that these specific details are not necessary in order to practice the present invention. In other instances, well known electrical structures and circuits have not been set forth in particular detail in order to not necessarily obscure the present invention.

During a data transfer, a source device sends data via a link to a receiver device. Typical devices can include items ranging from integrated circuit components to systems. When a source sends data to a receiver, a strobe or clock is also sent to the receiver. However, the exact arrival of a signal at the receiver and its signal quality can vary due to factors such as line discontinuities, parasitic capacitance & inductance, propagation delay, etc. The receiver has to know exactly when a signal is arriving and how to react.

When data arrives at the receiver, the data generally needs to be stored or latched away. Furthermore, if bits of data are being constantly transmitted and received, the receiver has to keep track of what bits are coming in and how to shift the data bits in the correct order. Logic, such as a write state machine, can place the bits in time sequence using the strobe as they arrive at the receiver.

Preserving the precise order of the data bits is critical. A strobe signal from the receiver often assists in this process. The strobe can serve two functions. First, a strobe signal can be used to capture data into a latch. Second, a strobe can help to place the bits in a proper sequence. For example, a receiving device can have a set of latches that behave like a cyclic buffer. Every time the strobe signal toggles, the receiver latches a data bit into a latch and advances a pointer to the next latch. The pointer advancement prevents the incoming bit from overwriting the stored data. Meanwhile, other logic in the receiving device can be reading out data from the previously written latches. By the time the last latch is filled, the first latch has been freed up and ready for new data. The pointer can wrap around and the latches are rewritten.

In source synchronous input/output (I/O) signaling, a precisely known data and strobe timing relationship is used to capture data at a receiver. Maintaining the integrity of the strobe signal and the write pointer is of great importance. The strobe edge is used to time the data and also to advance the state machine. Any glitches in the strobe can result in the incorrect advancement of the write pointer and also incorrect data capture. Incorrect data capture can be detected by using parity or ECC or CRC checks. However, an incorrect write pointer can lead to errors in subsequent data transfers and ultimately system failure. Strobe glitch issues can also be present in point to point links. Two types of problems can have an impact on data transfer. The first involves having extra pulses on the strobe signal. A second problem involves missing pulses on the strobe. In order to prevent strobe glitches, some circuit designers have implemented strobe glitch protection circuits into their components and systems.

A strobe glitch protection circuit can filter out the glitches and prevent the state machine from advancing states erroneously. Furthermore, the circuit can be configured to allow the data timing information to propagate through for proper data capture. These actions can be achieved by splitting the incoming strobe signal into two separate paths. One timing strobe path can retain the timing information and jitter. The other strobe path can be filtered to obtain a clean pointer strobe signal.

Embodiments of the present invention allow the write pointers to operate on clean strobes. Thus, accurate write state machine information can be maintained. Furthermore, the system reliability of a system or a component implementing an embodiment of the present scheme may not be limited by write pointer accuracy. This strobe glitch protection mechanism also provides an accurate cycle by cycle tracking between the data and strobe signals. Signal timing in the critical timing path is preserved as the path is kept free of additional circuit elements.

Depending on the implementation, alternative embodiments of the present mechanism can require fewer additional circuit elements than other glitch schemes. One method of present invention can also be adapted for use in a self clocked serial I/O link where no explicit strobing clocks are available.

Figure 2A:
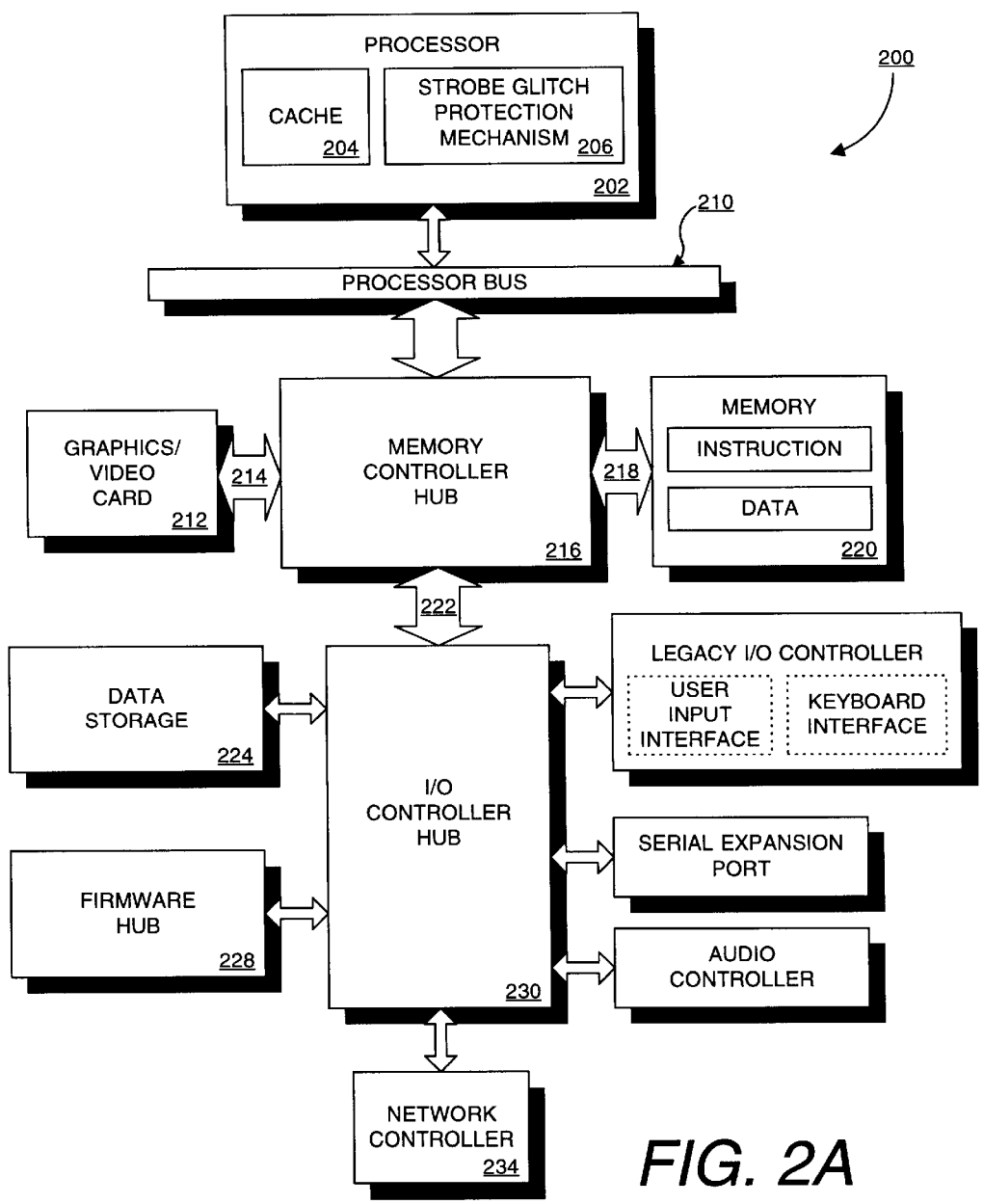
FIG. 2A illustrates one embodiment of a system employing a strobe glitch protection mechanism.

Referring now to FIG. 2A, a computer system 200 is shown. System 200 includes a component, such as a processor, employing a strobe glitch protection mechanism in accordance with the present invention, such as in the embodiment described herein. System 200 is representative of processing systems based on the PENTIUM®, PENTIUM® Pro, PENTIUM® II, PENTIUM® III microprocessors available from Intel Corporation of Santa Clara, Calif., although other systems (including PCs having other microprocessors, engineering workstations, set-top boxes and the like) may also be used. Thus, the present invention is not limited to any specific combination of hardware circuitry and software.

FIG. 2A is a block diagram of one embodiment of a system 200. The computer system 200 includes a processor 202 that processes data signals. FIG. 2A shows an example of an embodiment of the present invention implemented in a single processor system 200. However, it is understood that other embodiments may alternatively be implemented as systems having multiple processors. Processor 202 is coupled to a processor bus 210 that transmits data signals between processor 202 and other components in the system 200. The elements of system 200 perform their conventional functions well known in the art.

System 200 includes a memory 220. A cache memory 204 can reside inside processor 202 that stores data signals stored in memory 220. Alternatively, in another embodiment, the cache memory may reside external to the processor.

A strobe glitch protection mechanism 206 also resides in processor 202. Alternate embodiments of a strobe glitch protection mechanism 206 can also be used in microcontrollers, embedded processors, graphics devices, DSPs, and other types of logic circuits.

A system logic chip 216 is coupled to the processor bus 210 and memory 220. The processor 202 communicates to a memory controller hub (MCH) 216 via a processor bus 210. The MCH 216 directs data signals between processor 202, memory 220, and other components in the system 200 and bridges the data signals between processor bus 210, memory 220, and system I/O 222. The graphics card 212 is coupled to the MCH 216 through an Accelerated Graphics Port (AGP) interconnect 214.

System 200 uses a proprietary hub interface bus 222 to couple the MCH 216 to the I/O controller hub (ICH) 230. The ICH 230 provides direct connections to I/O devices such as a firmware hub (BIOS) 228, data storage 224, a serial expansion port such as Universal Serial Bus (USB), and a network controller 234.

The present enhancement is not limited to computer systems. Alternative embodiments of the present invention can be used in other devices such as, for example, handheld devices and embedded applications. Some examples of handheld devices include cellular phones, Internet Protocol devices, digital cameras, personal digital assistants (PDAs), and handheld PCs. Embedded applications can include a microcontroller, a digital signal processor (DSP), system on a chip, network computers (NetPC), set-top boxes, network hubs, wide area network (WAN) switches, or any other system which uses a latch type mechanism for other embodiments.

Figure 2B:
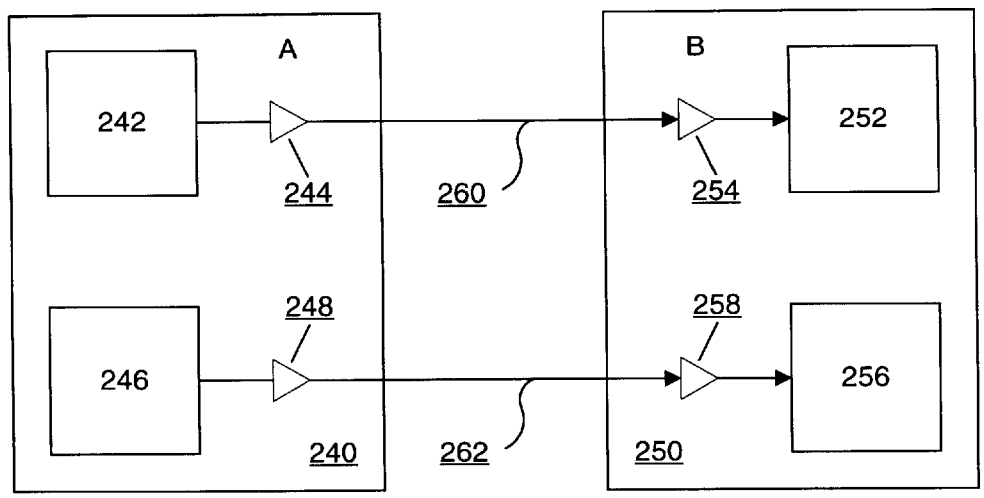
FIG. 2B illustrates one embodiment of a parallel I/O link between two components.

FIG. 2B illustrates one embodiment of a parallel I/O link between two components 240, 250. This example shows component A 240 communicating with component B 250 via a parallel I/O link. Parallel here refers to the use of separate signals for data 260 and strobe 262, and not the presence of multiple data lines in the link. During a data transfer, data 260 and strobe 262 are both driven from A 240 to B 250. Strobe 262 can be used to notify the receiver as to when data is available.

Component A 240 comprises a data source 242 and a strobe source 246. Data source 242 provides a data signal to an output driver 244, which in turn drives data 260 from component A 240 to component B 250. Strobe source 246 provides a strobe signal to an output driver 248, which in turn drives strobe 262 from A 240 to B 250.

Component B 250 comprises a data receiver 252 and a strobe receiver 256. Data signal 260 is received at input driver 254, which in turn provides the data to data receiver 252. Data receiver 252 may be a latch type mechanism. Strobe 262 is received at input driver 258 and propagated to strobe receiver 256. Strobe receiver 256 may be a write state machine.

Figure 2C:
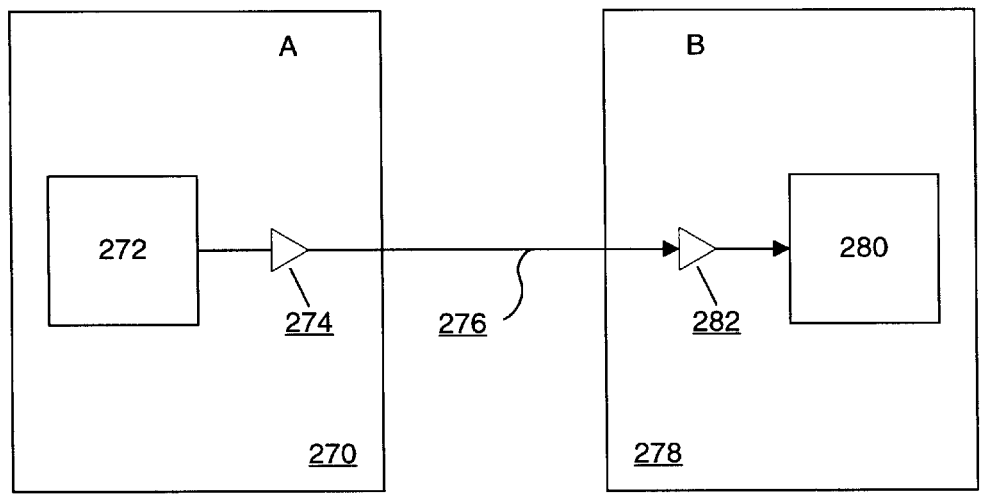
FIG. 2C illustrates one embodiment of a serial I/O link between two components.

FIG. 2C illustrates one embodiment of a serial I/O link between two components. This example shows component A 270 communicating with component B 278 via a serial I/O link. Serial here refers to the use of only a data signal and the absence of a strobe signal. During a data transfer, data 276 is driven from A 270 to B 278. Data 276 can include an embedded clock to notify the receiver as to when data is available.

Component A 270 comprises a data source 272. Data source 272 provides a data signal to an output driver 274, which drives data 276 from A 270 to B 278. Component B 278 comprises a data receiver 280. Data signal 276 is received at input driver 282, which provides the data to data receiver 280. Data receiver 278 may be a logic circuit that can generate a strobe from the embedded clock in data and latch the data.

Figure 3A:
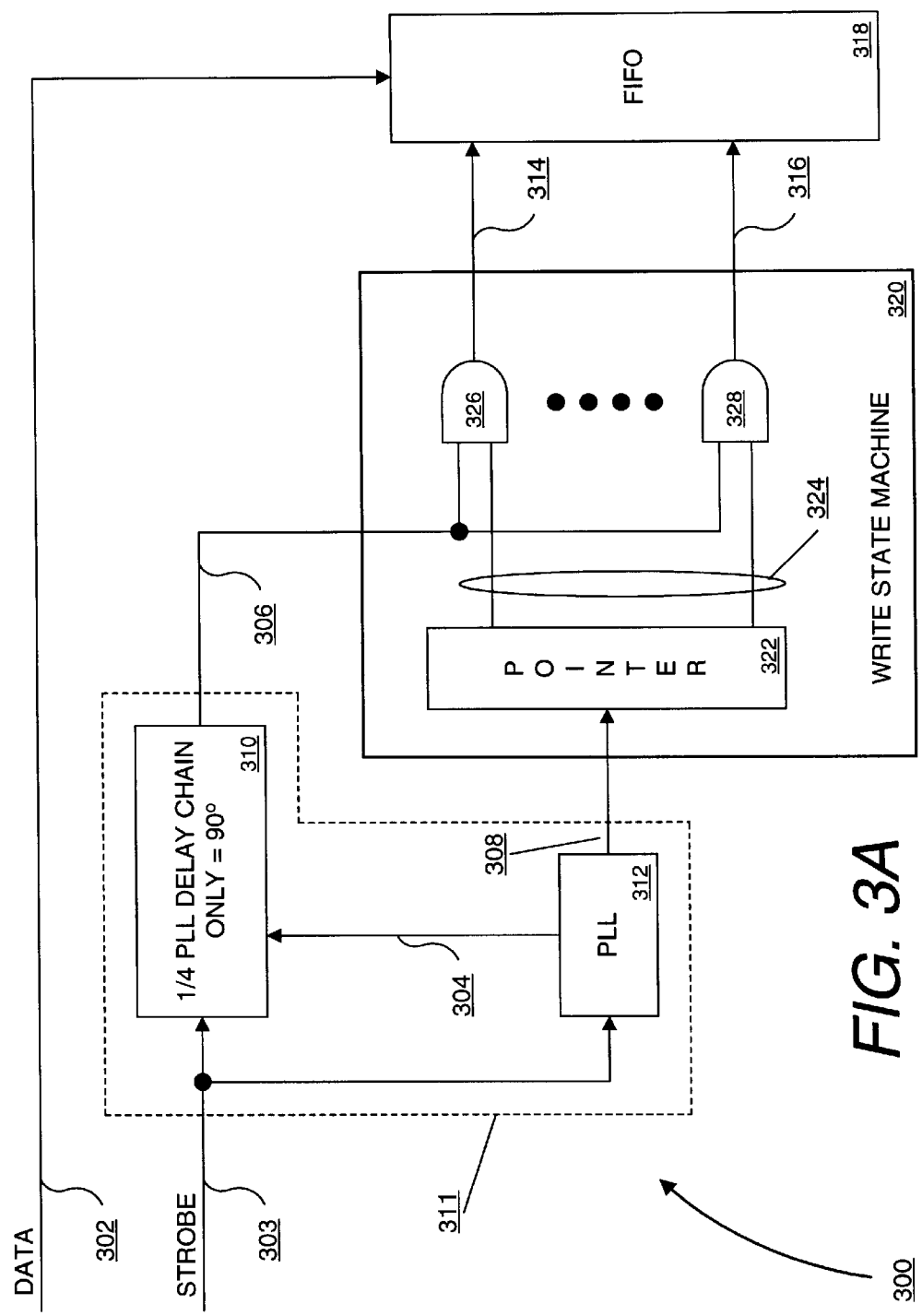
FIG. 3A illustrates one embodiment of a single ended source synchronous strobe and data circuit having a modified strobe path at the receiver end of a parallel I/O link.

FIG. 3A illustrates one embodiment of a single ended source synchronous strobe and data circuit 300 having a modified strobe path at the receiver end of a parallel I/O link. This circuit 300 receives a data signal DATA 302 and a strobe signal STROBE 303 from a data transfer source. DATA 302 is coupled is a set of FIFO latches 318. For alternative embodiments, other types of latch mechanisms can be used. STROBE 303 is coupled to a write state machine (WSM) 320 through a modified strobe path.

The modified strobe path 311 of the embodiment described here provides a first strobe 306 derived from a delay element 310 and a PLL filtered strobe 308 to the WSM 320. For this example, both the first strobe 306 and the PLL filter strobe 308 are rotated 90° relative to STROBE 303. The 90° rotation on the strobe signals centers the data window for latching. By splitting STROBE 303 into two separate signals, this scheme can provide a robust strobe 308 to the WSM 320 and also allow for tight data/strobe matching in the timing path. The timing path of FIG. 3A traces from the delay chain 310, along node 306, and through the latch enable logic 326, 328 to the FIFO latches 318.

The modified strobe path comprises a strobe glitch protection mechanism 311 that is coupled to STROBE 303. Strobe glitch protection mechanism 311 provides two versions of a delayed strobe 306, 308 to WSM 320. For this embodiment, the strobe glitch protection mechanism 311 comprises of a delay chain 310 and a phase locked loop (PLL) 312. The delay chain 310 is a ¼ PLL delay chain having a phase shift of 90° (or the desired rotation). The delay chain 310 generates a first delayed strobe 306 by shifting STROBE 303 by 90° as STROBE 303 passes through. Delayed strobe 306, also known as the timing strobe, is unfiltered relative to STROBE 303 such that cycle to cycle jitter is preserved to match DATA 302. Timing strobe causes the latching action to occur in the latches 318. By keeping the timing strobe in phase with DATA 302, timing loss and noise margins may be reduced. Hence, the timing paths of the DATA 302 and timing strobe are preserved from the output latch or driving pad of the sender over to the inbound latch of the receiver.

PLL 312 of this embodiment includes a voltage controlled oscillator such as a large inverter chain or a ring oscillator. The oscillator provides an oscillating signal based on the voltage level of a control signal. The oscillator can be controlled to speed up or slow down as desired. The oscillator is inputted a frequency at which to function. A phase detector attempts to lock the input and output signals of the oscillator.

The PLL 312 takes STROBE 303 and generates a second delayed strobe 308, pointer strobe. This second delayed strobe 308 is PLL filtered and rotated 90° with respect to STROBE 303. Pointer strobe 308 causes the WSM 320 to point at the latch to store DATA 302. Glitches are not desirable on the pointer strobe 308 because an incorrect pointer strobe 308 can lead to latching data in the wrong sequence. Noise and glitches can occur on signal lines due to transmission line reflections, mismatches, ground bounce, etc. PLL 312 also provides a control signal 304 to delay chain 310. Control signal 304 can cause the delay in the delay chain 310 to vary as needed. The shared control 304 of some embodiments can include analog voltages or digital bits.

If an extra pulse is seen on STROBE 303, pointer strobe 308 is still properly supplied a pulse from the oscillator. The PLL 312 tries to speed up the oscillator to catch up with the extra strobe pulse. However, the loop time constant is extremely large and the acceleration of the oscillator is converted to jitter instead. Similarly, when a pulse is missing on STROBE 303, pointer strobe 308 is still properly supplied a pulse from the oscillator. The PLL 312 tries to slow the oscillator to make up for the missing pulse. However, the loop time constant is extremely large and the deceleration of the oscillator is converted to opposite jitter. In either situation, the strobe glitch protection mechanism 311 is able to recover from the problem with STROBE 303. The glitches are converted to jitter and do not incorrectly advance or miss advancing the latch pointers.

The circuit 300 of the present embodiment is designed to latch data on the edge transition of a strobe pulse. The actual width of the strobe pulse is as important here. However, the strobe pulse should be reasonably close to the center of the timing window in order to maximize timing margins.

For this embodiment, an accurate strobe rotation path is provided by inserting a delay element path through delay chain 310 in parallel with PLL 312. Control elements in PLL 312 such as a delay element, control voltages, or control bits, can be shared with the delay chain 310 as with control signal 304. Cycle by cycle jitter tracking of the DATA 302 and STROBE 303 signals is also available.

The PLL 312 in the modified strobe path 311 of this embodiment filters out any occasional glitches in the strobe signal 303. The glitch is converted into additional jitter in the PLL 312 instead of being propagated as an invalid transition to WSM 320. Hence, the WSM 320 should get a clean strobe signal 308 and be able to maintain accurate state information.

The PLL 312 of one embodiment can use the same low pass filtering (LPF) capacitor as that of a DLL 112 in FIG. 1. An embodiment of the present strobe glitch mechanism may be implemented so that there are only small differences in performance characteristics such as area and power capture range between the DLL 112 and the PLL 312 solutions.

The first delayed strobe 306 is coupled to the latch enable logic 326, 328 in the WSM 320. The second delayed strobe 308 coupled to the pointer logic 322, which generates a plurality of latch select signals 324. Pointer logic 322 enables only one of the latch enable logic 326, 328. Latch select signals 324 are coupled to the latch enable logic 326, 328. Latch enable logic 326, 328 of this embodiment logically and together the first delayed strobe signal 306 and latch select signals 324 to generate a latch enable signal 314, 316. When the timing strobe 306 transitions, the selected latch enable logic will generate a pulse to the latches 318 to perform the latching action. Each one of these latch enable signals 314, 316 are used to sequentially activate a corresponding latch 318 to receive and store DATA 302. DATA 302 is not limited to a single data line. For alternative embodiments, the larger number of data lines may be used.

Figure 3B:
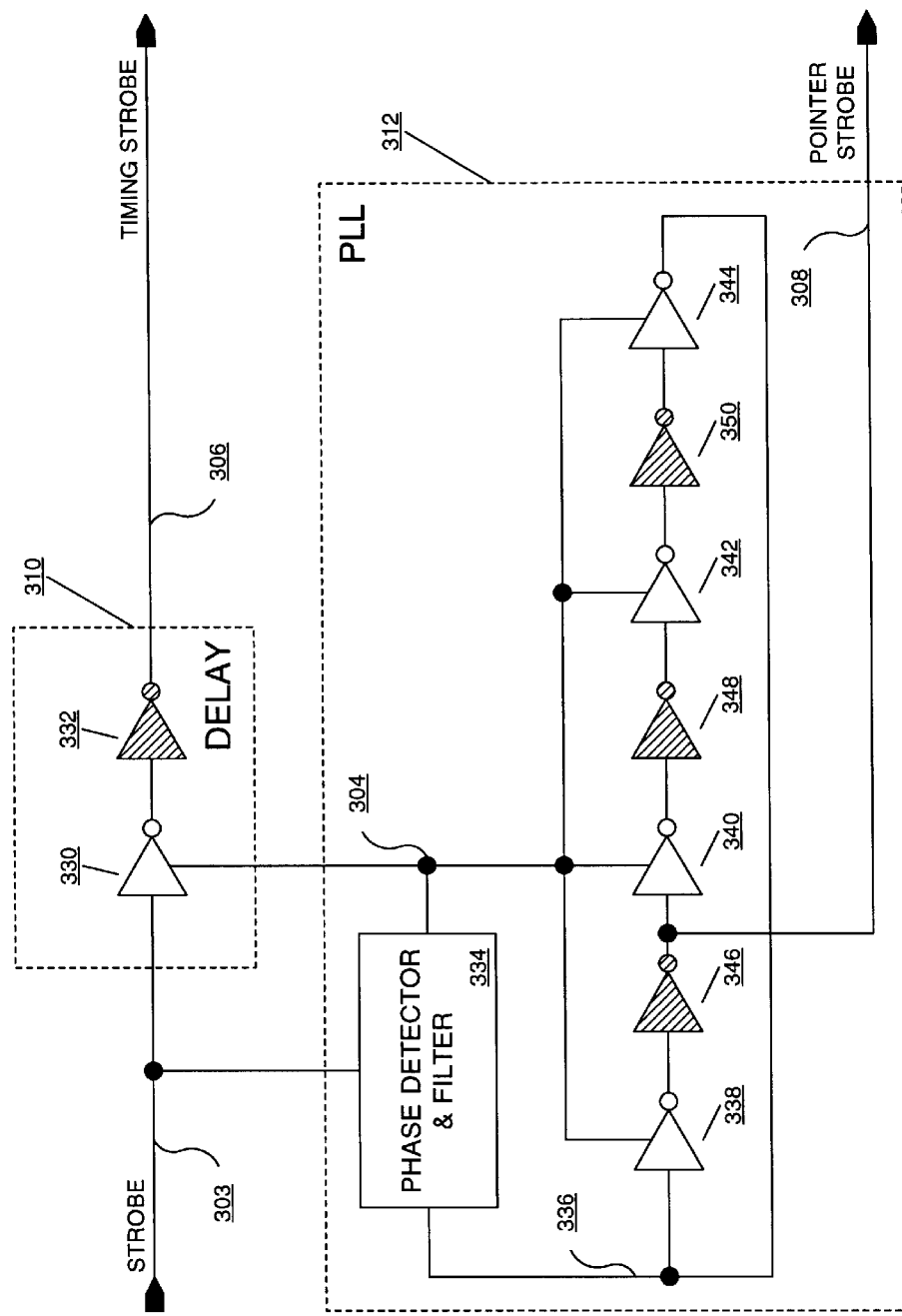
FIG. 3B illustrates one embodiment of strobe glitch mechanism in the modified strobe path of FIG. 3A.

FIG. 3B illustrates one embodiment of the strobe glitch mechanism 311 in the modified strobe path of FIG. 3A. This glitch strobe mechanism 311 comprises a delayed chain 310 and a PLL 312. STROBE 303 is connected to both the delay chain 310 and the PLL 312. The exemplary strobe glitch mechanism 311 of FIG. 3B includes two different strobe paths 306, 308.

Delay chain 310 of this embodiment is a ¼ PLL delay chain proving a 90° phase shift for STROBE 303. STROBE 303 is connected to the input of inverter 330. Delay chain 310 comprises an inverter 330 with a delay of τ chained to a fast inverter 332 with a delay of τ'. Delay τ of this embodiment is much larger than delay τ'. Inverter 330 is controlled with a control signal 304 that is generated from a phase detector and filter circuit 334 in the PLL 312. Control signal 304 can alter the transition speed of inverter 330. TIMING STROBE 306 is outputted from fast inverter 332. TIMING STROBE 306 of this embodiment is not filtered and retains the jittering characteristics of STROBE 303. Thus TIMING STROBE 306 can track the jittering of DATA 302.

STROBE 303 is connected to a phase detector and filter circuit 334. PLL 312 of this embodiment comprises a phase detector and filter circuit 334 and an oscillator inverter chain. Since a voltage controlled oscillator requires an odd number of inversions, extra inverter stages 346, 348, 350 were added to the oscillator of this embodiment. This inverter chain comprises of four inverters 338, 340, 342, 344 with delay τ chained to three fast inverters 346, 348, 350 with delay τ'. The output 336 of the inverter chain from inverter 344 is fed into the phase detector and filter circuit 334. A control signal 304 is generated based on the sampled signal 336 and STROBE 303. The transition rate of inverters 338, 340, 342, 344 can be modified by control signal 304 to speed up or slow down.

POINTER STROBE 308 is tapped from the inverter chain between the first fast inverter 346 and the second inverter 340. Because delay τ of this embodiment is much greater than τ', the phase shifts is predominately due to inverters 338, 340, 342, 344. Each of the inverters 338, 340, 342, 344 provide a phase shift of approximately 90°. The signal at node 308 is shifted approximately 90° from STROBE 303. The signal at node 336 has an offset of 0° degrees from STROBE 303. The signal between the second inverter 340 and the second fast inverter 348 has a offset of approximately 180° from STROBE 303. The signal between the third inverter 342 and the third fast inverter 350 has an offset of approximately 270° from STROBE 303. The phase shift of the signal between the fourth inverter 344 and STROBE 303 is approximately 360°. The fast inverters 346, 348, 350 invert the signal, but cause minimal phase shifts. Thus the error of the signal position of the transitions in the oscillator with respect to STROBE 303 is minimal. For this embodiment, POINTER STROBE 308 is a filtered and 90° rotated version of STROBE 303.

Figure 3C:
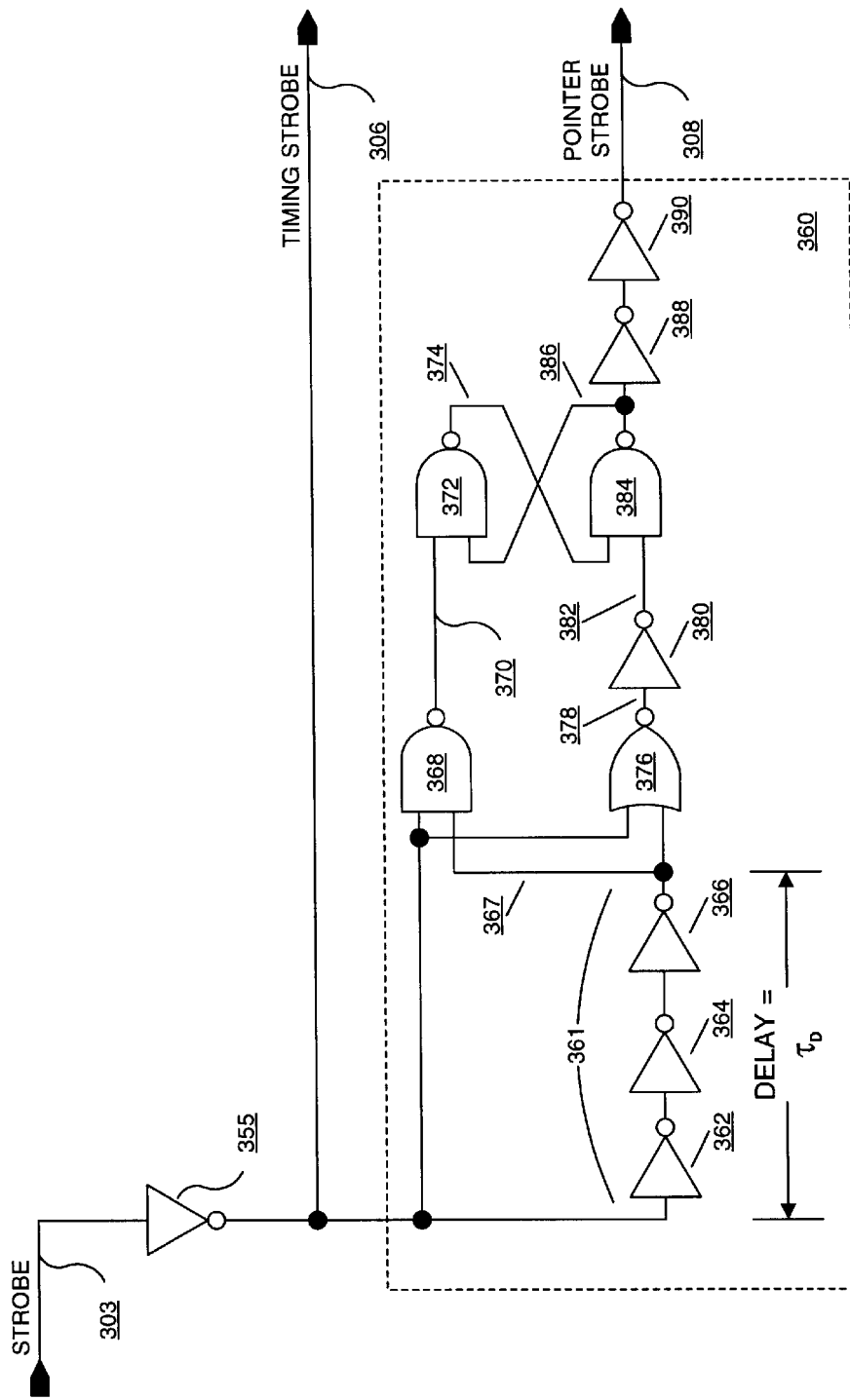
FIG. 3C illustrates another embodiment of the modified strobe path of FIG. 3A including a glitch filtering mechanism.

FIG. 3C illustrates another embodiment of the modified strobe path of FIG. 3A including a glitch filtering mechanism 360. STROBE 303 is coupled the input terminal of an inverter 355. Inverter 355 provides a 180° phase shifted version of STROBE 303 at its output terminal. For alternative embodiments, this shift may be performed at the data sender, making this inverter 355 unnecessary. The output terminal of inverter 355 is TIMING STROBE 306. This glitch filtering circuit 360 filters STROBE 303 for the pointer path.

TIMING STROBE 306 is also coupled to the glitch filtering mechanism 360. The logic of this circuit 360 can be designed to catch and filter out certain types of glitches in the input signal, TIMING STROBE 306 in this example. This mechanism 360 includes an inverter delay chain 361 having at total delay of τ$_D$. The number of inverters in the delay chain 361 can be increased and decreased to obtain the desired delay. For this embodiment, the inverter chain 361 propagates TIMING STROBE 306 through three inverters 362, 364, 366. The output of the final inverter 366 of inverter chain 361 is connected to a second terminal of nand gate 368 and a second terminal of nor gate 376. TIMING STROBE 306 is connected to a first terminal of nand gate 368 and a first terminal of nor gate 376.

Logic gates 372, 380, 384 are connected together to form an R-S type latch mechanism. Node 370 can be viewed as SET#, node 378 as RESET, node 382 as RESET#, node 374 as Q, and node 386 as Q#. The output terminal 370 of nand gate 368 is connected to a first input of nand gate 372. The output terminal 374 of nand gate 372 is fed to a first input terminal of nand gate 384. The output terminal 378 of nor gate 376 is connected to the input terminal of inverter 380, whose output terminal 382 is connected to a second input terminal of nand gate 384. The output terminal 386 of nand gate 384 is fed to a second input terminal of nand gate 372. The output terminal 386 of nand gate 384 is also connected to the input terminal of inverter 388, whose output terminal is connected to the input of output driver 390. The signal at the output terminal of driver 390 is POINTER STROBE 308.

Glitch filtering circuit 360 takes an incoming signal, node 306 in this example, and filters out certain types of glitches.

The path through delay chain 361 has a delay of $\tau_D$. The circuit 360 of this embodiment filters out transitions on the incoming signal that occur within a window of width D provided that $\tau_D$ is greater than D. Time D is the time duration of the glitch or transitions. If the incoming signal glitches or transitions, but returns to its original signal level with a certain time D, then the circuit 360 of this embodiment can filter out the glitches or movements if D is less than $\tau_D$. The delay may be stabilized across process voltage and temperature variations using a compensated delay chain such as used in a Voltage Controlled Oscillator.

It should be noted that the filtered pointer strobe is delayed by $\tau_D$, that may be acceptable in slower interfaces. For fast interfaces, the delay in the pointer strobe path must be matched by the timing strobe path delay.

Figure 3D:
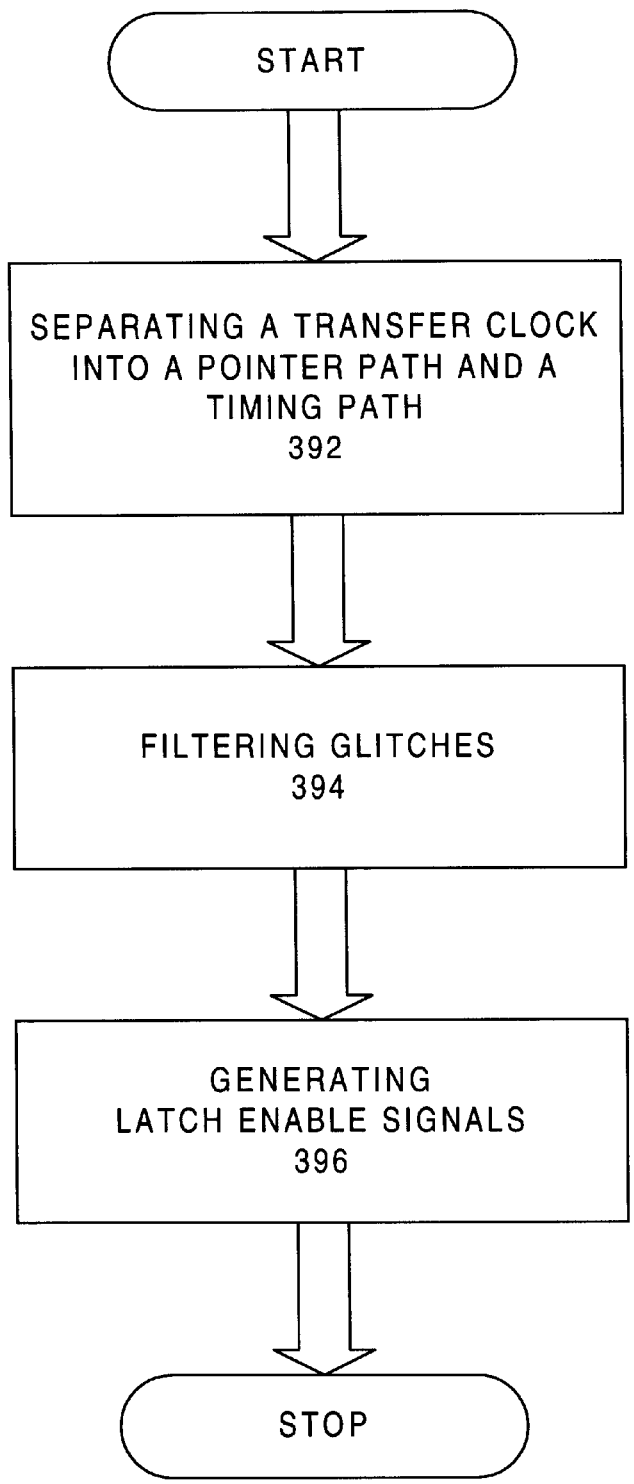
FIG. 3D illustrates a flow chart of a method for strobe glitch protection for one embodiment.

FIG. 3D illustrates a flow chart of a method for strobe glitch protection for one embodiment. For this embodiment, a transfer clock is separated into a pointer path and a timing path at step 392. The pointer path comprises a pointer strobe and the timing path comprises a timing strobe. At step 394, glitches are filtered from the pointer path. The pointer path and timing path are coupled at step 396 to generate latch enable signals to latch data bits.

For alternative embodiments, such as in a serial link, the method for strobe glitch protection will be different from FIG. 3D. In a serial I/O link, a data input having a plurality of signal transitions is received. The data input comprises of data and an embedded clock. A clock signal is extracted from the data input. A timing strobe and pointer strobe are generated. A latch enable signal is in turn generated from the timing strobe and pointer strobe. The latch enable signal is used to latch data from the data input.

Figure 4:
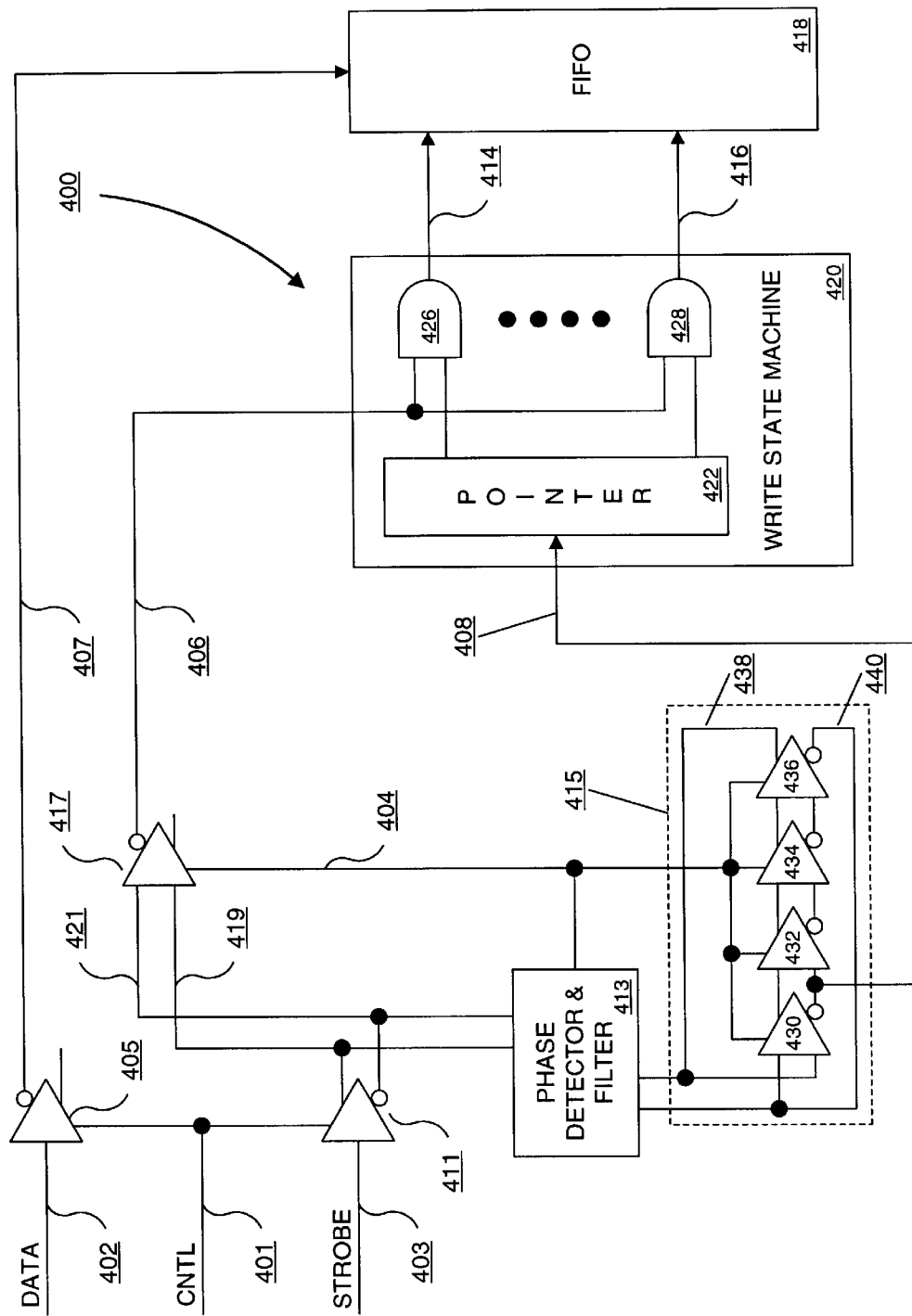
FIG. 4 illustrates one embodiment of a single ended source synchronous strobe and data circuit including a differential VCO at the receiver end of a parallel I/O link.

FIG. 4 illustrates another embodiment of a single ended source synchronous strobe and data circuit 400 including a differential voltage controlled oscillator (VCO) 415 at the receiver end of a parallel I/O link. This circuit 400 takes single ended inputs, such as DATA 402 and STROBE 403, and converts the signals into differential signals. Hence this embodiment can be used in a singled ended implementation.

DATA signal 402 comes into the input of a single ended to differential converter 405. Similarly, STROBE signal 403 is connected to the input of another single ended to differential converter 411. Control signal CNTL 401 is connected to the differential converters 405, 411 to adjust and set the delay (usually least). The signal paths and differential converters 405, 411 on DATA 402 and STROBE 403 are matched in order to maintain the transition and timing relationships of the signals. The inverted version of DATA 402 at that output terminal 407 of differential converter 405 is connected to the FIFO latches 418.

The two outputs (normal 419 and inverted 421) of the strobe differential converter 411 are connected to a phase detector and filter 413 and a third differential converter 417. The third differential converter 417 provides a 90° shifted inverted output 406 of the signals 419, 421. This inverted output SHIFT STROBE 406 is coupled to latch enable logic 426, 428 in the WSM 420.

The differential VCO 415 of this example comprises of four differential converters 430, 432, 434, 436 chained together. The outputs 438, 440 of the final stage 436 are fed back to the input terminals of the first stage 430 and also to the phase detector and filter 413. The phase detector and filter circuit samples the outputs 419, 421 of the strobe differential converter and the outputs 438, 440 of the last stage 436 in the VCO 415, and generates a control signal 404. Control signal 404 is connected to the differential converters 430, 432, 434, 436 of the VCO 415 and the strobe differential converter 417.

For this embodiment, the differential VCO is set for accurate 90° delays. The four differential converters 430, 432, 434, 436 in the VCO 415 each provide a 90° shift in the signal. POINTER STROBE 408 is tapped off at the 90° point between the first 430 and second 432 converters. POINTER STROBE 403 is coupled from the VCO 415 to pointer logic 422 in the WSM 420. Pointer logic 422 generates a plurality of latch select signals coupled to latch enable logic 426, 428. Latch enable logic 426, 428 logically and together the TIMING STROBE 406 and latch select signals to generate latch enable signals 414, 416. Each one of these latch enable signals 414, 416 are used to sequentially activate a corresponding latch 418 to receive and store the shifted version 407 of DATA 402. Further it must be noted that the write state machine and the timing path and the FIFO can be maintained differential after the single ended to differential conversion. Also the circuit shown in FIG. 4 is easily adapted to differential data and strobe signals. The single ended to differential stages 405 and 411 are replaced by differential receivers.

Not all data transfers or communications are performed over parallel I/O links having separate data and strobe lines. A serial I/O link may also be used. Serial links can be cheaper than parallel links since only one signal line is needed, and they can be faster as there is no interconnect induced skew between strobe and data. For instance, a transmission medium such as a cable link is expensive. Minimizing the number of wires needed can reduce costs.

A serial link does not have an explicit strobing clock. Serial I/O links with an embedded clock are also used to transfer data. In serial links, the latching of the data occurs using a recovered clock from the data stream. The clock recovery employs a special PLL which uses the data transitions to act as the reference. This PLL effectively isolates the data and clock jitter tracking on a cycle by cycle basis.

Figure 5A:
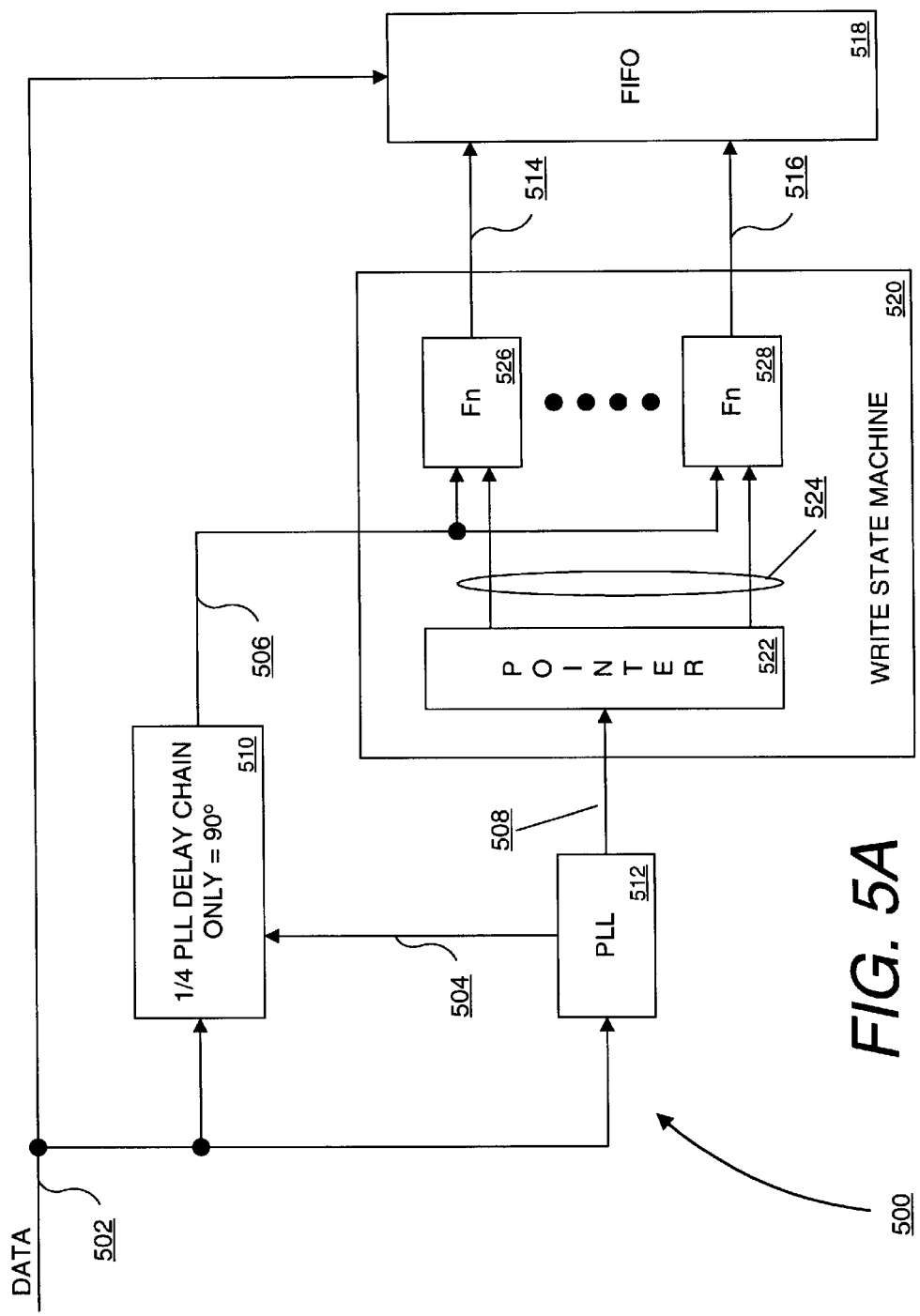
FIG. 5A illustrates one embodiment of a data circuit at the receiver end of a serial I/O link.

FIG. 5A illustrates one embodiment of a data circuit 500 at the receiver end of a serial I/O link. This circuit 500 receives a data signal DATA 502 from a data transfer source. DATA 502 is coupled to a set of FIFO latches 518, a PLL delay chain 510, and a PLL 512. This serial I/O link does not include a strobe signal. The latching edge to capture DATA 502 in the FIFO latches 518 needs to be generated from DATA 502 itself. For this embodiment, the latching clock 506 needs to include the pointer position and trigger edge. The trigger edge can be a low to high transition or a high to low transition depending on the data values. A clock can be created by including a edge to pulse converter circuit in delay chain 510 or elsewhere along the critical timing path. The critical timing path of this example traces from the delay chain 510, along clock signal 506, through latch enable logic 526, 528, and latch enables 514, 516 to the latches 518.

The PLL delay chain 510 of this embodiment provides a phase shift of 900 to DATA 502 and generates a clock signal 506 as a delayed version of DATA 502. The clock signal 506 is coupled to latch enable logic 526, 528 in the WSM 520. The latch enable logic of this embodiment is a logic block Fn 526, 528 able to generate select signals 514, 516 for a serial link. The delay chain 510 of this embodiment also preserves timing jitters in DATA 502 and thus maintaining the clocking relationship between DATA 502 and clock signal 506. Timing margin is also improved in the data latching operations.

The PLL 512 of this embodiment is designed to use the intermittent signal transitions edges of DATA 502 to latch.

The PLL 512 transforms faulty edges into a jitter term. The PLL 512 takes DATA 502 and generates a POINTER STROBE signal 508 to pointer logic in the WSM 520. PLL 512 also provides a control signal 504 to delay chain 510. Control signal 504 can cause the delay in the delay chain 510 to vary as needed. The pointer logic 522 generates a plurality of latch select signals 524, which are coupled to Fn 526, 528. Fn 526, 528 uses clock signal 506 and latch select signals 524 to generate latch enable signals 514, 516. Each one of these latch enable signals 514, 516 are used to sequentially activate a corresponding latch 518 to receive and store DATA 502. If there is no data edge, such as when two consecutive data bits are the same level, then the pointer strobe 508 is toggled and latch select signals 524 advanced appropriately.

Figure 5B:
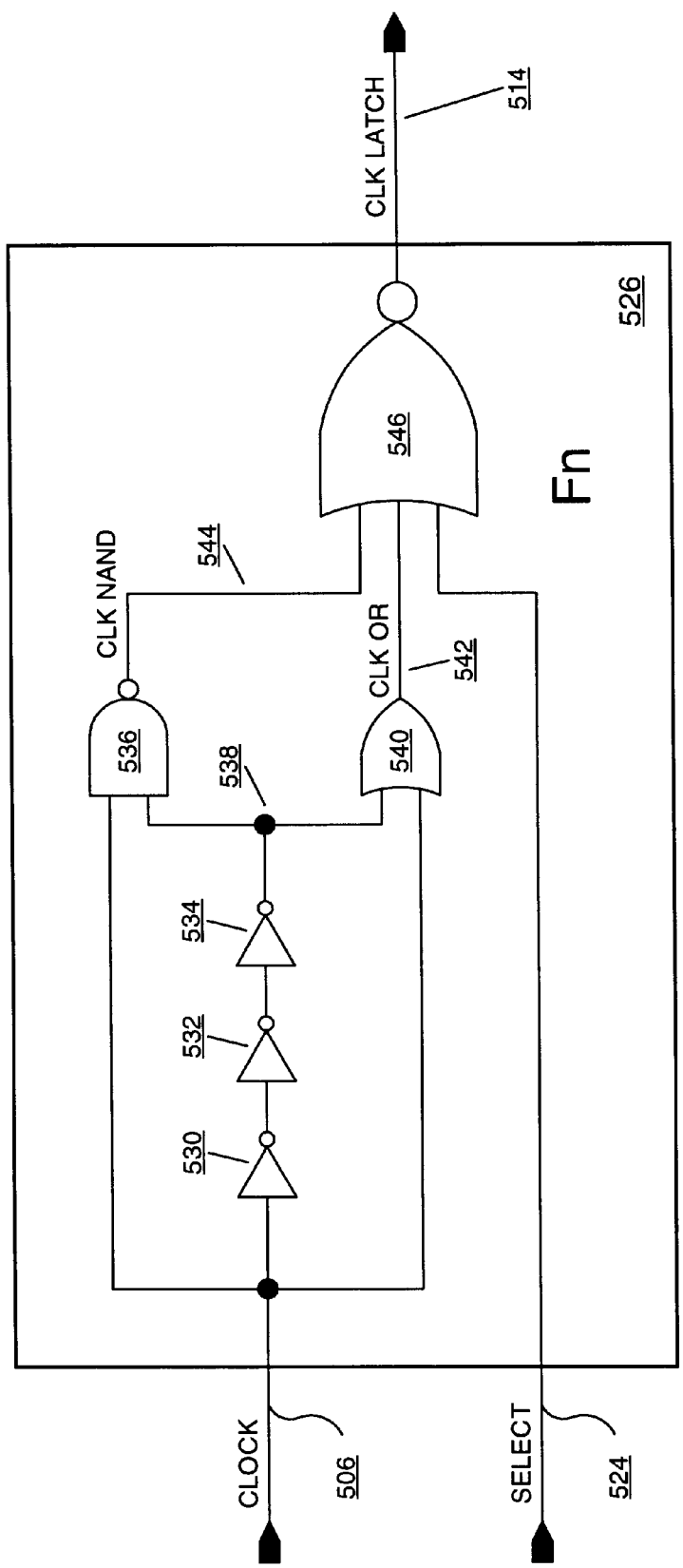
FIG. 5B illustrates one embodiment of the latch enable mechanism of FIG. 5A.

FIG. 5B illustrates one embodiment of the latch enable mechanism Fn 526 of FIG. 5A. Input signals CLOCK 506 and SELECT 524 are coupled to Fn 526. CLOCK 506 is connected to a first terminal of nand gate 536, to a first terminal of or gate 540, and to the input terminal of inverter 530. Three inverters 530, 532, 534 for a delay chain. A delayed version 538 of CLOCK 506 is propagated from the output terminal of inverter 534 to a second input terminal of nand gate 536 and to a second input terminal of or gate 540.

CLOCK signal 506 and the delayed CLOCK 538 signal are nanded together to generate CLK NAND 544. CLOCK signal 506 and the delayed CLOCK 538 signal are ored together to generate CLK OR 542. The output signal CLK NAND 544 from nand gate 536 is connected to an input terminal of nor gate 546. Similarly, the output signal CLK OR 542 of or gate 540 is connected to as second input terminal of nor gate 546. SELECT 524 is connected to a third input terminal of nor gate 546. The output of the three input nor gate 546, and Fn 526, is CLK LATCH 514. CLK LATCH 514 can be activated to enable a latch to capture data.

In the foregoing specification, the invention has been described with reference to specific exemplary embodiments thereof. It will, however, be evident that various modifications and changes may be made thereof without departing from the broader spirit and scope of the invention as set forth in the appended claims. The specification and drawings are, accordingly, to be regarded in an illustrative rather than a restrictive sense.

What is claimed is:

1. A method comprising:
   separating a transfer clock having a plurality of transfer clock edges into a pointer path and a timing path, wherein said pointer path and said timing path have dissimilar timing;
   filtering glitches from signals on said pointer path and allowing certain glitches from said transfer clock to appear on signals on said timing path; and
   coupling said pointer path and said timing path to generate latch enable signals to latch data bits.

2. The method of claim 1 wherein said timing path comprises a timing strobe, said timing strobe retaining jittering of said transfer clock.

3. The method of claim 1 wherein said pointer path comprises a pointer strobe.

4. The method of claim 3 wherein said pointer strobe activates latch enable logic.

5. The method of claim 1 further comprising generating a clock signal for said pointer path.

6. The method of claim 1 further comprising delaying propagation of said transfer clock to said timing path.

7. An apparatus comprising:
   a strobe glitch protection mechanism configured to receive a strobe signal, said glitch protection mechanism further configured to provide a timing strobe and a pointer strobe, said timing strobe to include timing information from said strobe signal, and said pointer strobe to be filtered of one or more glitch on said strobe signal; and
   a state machine coupled to said strobe glitch protection mechanism, said state machine configured to receive said timing strobe and said pointer strobe, and to generate a latch enable signal based on said timing strobe and said pointer strobe.

8. The apparatus of claim 7 wherein said glitch protection mechanism comprises a phased locked loop to generate a pointer strobe.

9. The apparatus of claim 7 wherein said glitch protection mechanism comprises a delay mechanism to generate a timing strobe.

10. The apparatus of claim 7 wherein said glitch protection mechanism comprises a glitch filter mechanism to remove glitches having a duration less than a set time limit on said strobe signal.

11. The apparatus of claim 7 wherein said pointer strobe is rotated 90° relative to said strobe signal.

12. The apparatus of claim 7 wherein said timing strobe is rotated 90° relative to said strobe signal and retains jittering of said strobe signal.

13. The apparatus of claim 7 wherein said strobe glitch mechanism splits said strobe signal into a timing path and a pointer path.

14. The apparatus of claim 7 further comprising a latch mechanism coupled to said state machine.

15. The apparatus of claim 7 wherein said latch enable signal is used latch data bits.

16. An integrated circuit device comprising:
   a data input configured to receive data bits;
   a strobe input configured to receive a strobe signal;
   a circuit coupled to said data input and said strobe input, said circuit to configured to receive data from an I/O link, said circuit comprising:
      a strobe glitch protection mechanism to receive a strobe signal, said glitch protection mechanism configured to provide a timing strobe and a pointer strobe, said timing strobe including timing information from said strobe signal, and said pointer strobe filtered of one or more glitch appearing on said strobe signal;
      a state machine coupled to said strobe glitch protection mechanism, said state machine configured to receive said timing strobe and said pointer strobe, and to generate a latch enable signal based on said timing strobe and said pointer strobe; and
      a latch mechanism coupled to said write state machine, said latch mechanism configured to receive a plurality of data bits and said latch enable signal, said latch mechanism to latch said data bits in accordance with said latch enable signal.

17. The integrated circuit device of claim 16 wherein said integrated circuit device is a processor.

18. The integrated circuit device of claim 16 wherein said integrated circuit device is a firmware hub.

19. The integrated circuit device of claim 16 wherein said integrated circuit device is a memory device.

20. A system comprising:
   a system bus, said bus configured to propagate data bits and a clock signal;

an I/O interface coupled to said system bus;

a component coupled to said system bus, said component to receive data from an I/O link during a data transfer, said component comprising:

a strobe glitch protection mechanism configured to receive a strobe signal, said glitch protection mechanism further configured to provide a timing strobe and a pointer strobe, said timing strobe to include timing information from said strobe signal, and said pointer strobe to be filtered of one or more type of glitch on said strobe signal;

a state machine coupled to said strobe glitch protection mechanism, said state machine configured to receive said timing strobe and said pointer strobe, and to generate a latch enable signal based on said timing strobe and said pointer strobe;

a latch mechanism coupled to said write state machine, said latch mechanism configured to receive a plurality of data bits and said latch enable signal, said latch mechanism to latch said data bits in accordance with said latch enable signal.

21. The system of claim 20 wherein said timing strobe retains jittering of said strobe signal.

22. The system of claim 20 wherein glitches are filtered from said pointer strobe.

23. The system of claim 20 wherein said strobe glitch mechanism splits said strobe signal into a timing path and a pointer path.

24. The system of claim 20 wherein said I/O interface is coupled to data transfer source.

25. A method comprising:

receiving a data input having a plurality of signal transitions, said data input comprising data and an embedded clock;

extracting a clock signal from said data input and generating a timing strobe and a pointer strobe, said timing strobe to include timing information from said strobe signal, and said pointer strobe to be filtered of at least one type of glitch on said strobe signal;

generating a latch enable signal from said timing strobe and said pointer strobe; and using said latch enable signal to latch said data from said data input.

26. The method of claim 25 wherein said timing strobe retains jitters of said data input.

27. The method of claim 25 wherein said timing strobe is a delayed version of said data input.

28. The method of claim 25 wherein said pointer strobe controls activation of latching.

29. A method comprising:

separating a strobe signal into a pointer strobe on a pointer path and a timing strobe on a timing path, said pointer strobe filtered of one or more strobe glitches that appear on said strobe signal, said timing strobe unfiltered of said strobe glitches and retaining timing information and jitter from said strobe signal;

generating a select signal in response to said pointer strobe, said select signal to select one of a plurality of data latches;

generating a latch enable signal in response to said timing strobe for said selected data latch, said latch enable signal to activate said data latch to capture data.

30. The method of claim 29 further comprising receiving said pointer strobe at a write state machine, said write state machine to sequentially activate and deactivate select signals in response to transitions on said pointer strobe.

31. The method of claim 30 further comprising receiving said timing strobe at latch enable logic, said latch enable logic to provide a latch pulse to selected data latch based on a logical combination of said select signals and said timing strobe.

32. The method of claim 31 wherein said pointer strobe and said timing strobe are dissimilar versions of said strobe signal.

33. The method of claim 32 wherein said pointer strobe and said timing strobe have dissimilar signal timing.

\* \* \* \* \*

UNITED STATES PATENT AND TRADEMARK OFFICE
CERTIFICATE OF CORRECTION

PATENT NO. : 6,622,256 B1 Page 1 of 1
DATED : September 16, 2003
INVENTOR(S) : Dabral et al.

It is certified that error appears in the above-identified patent and that said Letters Patent is hereby corrected as shown below:

Column 10,
Line 56, delete "900", insert -- 90° --.

Signed and Sealed this

Twenty-fifth Day of May, 2004

JON W. DUDAS
*Acting Director of the United States Patent and Trademark Office*